(12) United States Patent
Wang et al.

(10) Patent No.: US 7,772,072 B2
(45) Date of Patent: Aug. 10, 2010

(54) METHOD FOR MANUFACTURING NON-VOLATILE MEMORY

(75) Inventors: Szu-Yu Wang, Hsinchu (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 206 days.

(21) Appl. No.: 11/845,945

(22) Filed: Aug. 28, 2007

(65) Prior Publication Data

US 2009/0057752 A1 Mar. 5, 2009

(51) Int. Cl.
H01L 29/792 (2006.01)

(52) U.S. Cl. .............. 438/287; 257/325; 257/E21.423; 257/E29.309; 438/216; 438/288

(58) Field of Classification Search .................. 257/324, 257/325, E21.423, E29.309; 438/216, 287, 438/288
See application file for complete search history.

(56) References Cited

U.S. PATENT DOCUMENTS

| | | | |
|---|---|---|---|
| 4,870,470 A | 9/1989 | Bass, Jr. et al. | |
| 6,642,573 B1 | 11/2003 | Halliyal et al. | |
| 6,797,650 B1 | 9/2004 | Wang et al. | |
| 6,955,965 B1 | 10/2005 | Halliyal et al. | |
| 7,001,810 B2 | 2/2006 | Dong et al. | |
| 7,012,299 B2 * | 3/2006 | Mahajani et al. | 257/324 |
| 7,060,594 B2 | 6/2006 | Wang | |
| 2004/0009642 A1* | 1/2004 | Yoo et al. | 438/257 |
| 2005/0035429 A1 | 2/2005 | Yeh et al. | |
| 2006/0073642 A1* | 4/2006 | Yeh et al. | 438/132 |
| 2006/0113586 A1* | 6/2006 | Wang | 257/324 |
| 2006/0261401 A1 | 11/2006 | Bhattacharyya | |

FOREIGN PATENT DOCUMENTS

CN 1832201 A 9/2006

OTHER PUBLICATIONS

Chinese First Examination Report of China Application No. 200710140283X, dated Jun. 19, 2009.

* cited by examiner

Primary Examiner—Anh Phung
Assistant Examiner—Michael Lulis
(74) Attorney, Agent, or Firm—J.C. Patents

(57) ABSTRACT

A non-volatile memory located on a substrate is provided. The non-volatile memory includes a tunnel layer, a charge trapping composite layer, a gate and a source/drain region. The tunnel layer is located on the substrate, the charge trapping composite layer is located on the tunnel layer and the gate is located over the charge trapping composite layer. The source/drain region is located in the substrate on both sides of the tunnel layer. With the charge trapping composite layer, the non-volatile memory has relatively better programming and erasing performance and higher data retention ability. Furthermore, since there is no need to perform a thermal process in the formation of the charge trapping composite layer, thermal budget of the manufacturing process is low.

23 Claims, 4 Drawing Sheets

METHOD FOR MANUFACTURING NON-VOLATILE MEMORY

BACKGROUND OF THE INVENTION

1. Field of the Invention

The present invention generally relates to a non-volatile memory device and manufacturing method thereof, and more particularly, to a non-volatile memory having a composite type of charge-trapping layer and method for manufacturing the same.

2. Description of Related Art

Electrically programmable and erasable non-volatile memorizing techniques based on charge storage structure such as electrically erasable programmable read-only-memory and flash memory have multiple modern applications.

With the miniaturization of integrated circuits, charge-trapping layer based memory unit structure has become more and more critical due to the measurability and simplicity of the manufacturing process. The charge-trapping layer based memory unit structure includes, for example, nitride trapping layer memory, silicon-oxide-nitride-oxide-silicon (SONOS) and Bandgap-Engineered silicon-oxide-nitride-oxide-silicon (BE-SONOS). These memory unit structures store data by trapping charges in the charge-trapping layer (for example, a silicon nitride layer).

Moreover, the conventional non-volatile memory mainly uses a polysilicon material layer as a charge storage layer (that is, a floating gate). Once the tunnel oxide layer produces a leakage path, all the stored electric charges will leak away. This is a big challenge to the characteristics, reliability and tolerance of the device. Therefore, a silicon-oxide-nitride-oxide-silicon (SONOS) structure has been developed to deal with the problem. Because the nitride layer is rich with charge storage centers, it can be used for charge storage. Moreover, because the nitride layer is a dielectric layer, lost of charges as a result of a leakage path in the tunnel oxide layer can be prevented.

If the silicon nitride of the silicon nitride layer in the SONOS structure is a nitrogen-rich silicon nitride film, the silicon nitride layer has mostly deep energy level charge storage centers so that the charge trapping density is poorer compared with the shallow energy level defects. However, if the silicon nitride is an silicon-rich silicon nitride film, the silicon nitride layer has mostly shallow energy level charge storage centers. Although the charge trapping density is higher, the leaking rate is also higher and can lead to very low charge storage ability. Furthermore, the thermal budget of the conventional method for forming the SONOS is too high and potentially impact on the device performance. Therefore, by adjusting the atomic composition and content of the nitride layer, the characteristics of the device including its speed, reliability and tolerance can be affected.

SUMMARY OF THE INVENTION

Accordingly, the present invention provides a non-volatile memory having better programming and erasing ability.

The present invention also provides a method of fabricating a non-volatile memory capable of lowering of thermal budget of the manufacturing process.

According to an embodiment of the present invention, a non-volatile memory disposed on a substrate is provided. The non-volatile memory includes a tunnel layer, a charge-trapping composite layer, a gate and a source/drain. The tunnel layer is located on the substrate, the charge-trapping composite layer is located on the tunnel layer and the gate is located over the charge-trapping composite layer. The source/drain is located in the substrate on both sides of the tunnel layer.

According to the non-volatile memory in a preferred embodiment of the present invention, a blocking layer is disposed between the charge-trapping composite layer and the gate.

According to the non-volatile memory in a preferred embodiment of the present invention, the charge-trapping composite layer includes a silicon nitride layer and a silicon oxynitride layer. The silicon oxynitride layer is located over the silicon nitride layer. Furthermore, the thickness of the silicon oxynitride layer is about 20%~80% the thickness of the charge-trapping composite layer. Moreover, the atomic concentration of oxygen element in the silicon oxynitride layer is up to 15%.

According to the non-volatile memory in a preferred embodiment of the present invention, the charge-trapping composite layer includes a silicon oxynitride material and a silicon nitride material. The composition of the silicon oxynitride material gradually decreases from an upper surface of the charge-trapping composite layer to a lower surface of the charge-trapping composite layer. Furthermore, the concentration of the oxygen atoms in the silicon oxynitride material is up to 15%. In the charge-trapping composite layer, the composition of the silicon oxynitride material is about 20%~80%. Additionally, the silicon oxynitride material is distributed close to the upper surface of the charge-trapping composite layer.

According to the non-volatile memory in a preferred embodiment of the present invention, the tunnel layer includes a first oxide layer, a tunnel nitride layer and a second oxide layer. The first oxide layer is located on the substrate, the tunnel nitride layer is located on the first oxide layer, and the second oxide layer is located on the tunnel nitride layer.

The present invention also provides a method of forming a non-volatile memory on a substrate. The method includes forming a tunnel layer on the substrate. Thereafter, a charge-trapping composite layer is formed on the tunnel layer. After that, a gate is formed over the charge-trapping composite layer.

According to the method of forming the non-volatile memory in a preferred embodiment of the present invention, the method of forming the charge-trapping composite layer further includes forming a silicon nitride layer on the tunnel layer. Thereafter, a silicon oxynitride layer is formed on the silicon nitride layer. The method of forming the silicon nitride layer includes performing a chemical vapor deposition process, an atomic layer deposition process or a plasma enhanced chemical vapor deposition process. The method of forming the silicon oxynitride layer includes performing a chemical vapor deposition process or a plasma enhanced chemical vapor deposition process. Additionally, the thickness of the silicon oxynitride layer is about 20%~80% the thickness of the charge-trapping composite layer. Furthermore, the concentration of the oxygen atoms in the silicon oxynitride layer is up to 15%.

According to the method of forming the non-volatile memory in a preferred embodiment of the present invention, the method of forming the charge-trapping composite layer includes forming a silicon nitride layer on the tunnel layer. Thereafter, an oxidation process is performed to form a silicon oxynitride region in the silicon nitride layer, wherein the silicon oxynitride region is close to a top surface of the silicon nitride layer. Moreover, after performing the oxidation process, further includes performing a nitridation process so that the silicon oxynitride region is transformed to be nitrogen-rich. The nitridation process includes a plasma nitridation process and a thermal nitridation process. Furthermore, after the nitridation process, the concentration of oxygen atoms in the silicon oxynitride region of the charge-trapping composite layer is up to 15%. In addition, the thickness of the nitrogen-rich silicon oxynitride region is about 20%~80% the thickness of the charge-trapping composite layer.

According to the method of forming the non-volatile memory in a preferred embodiment of the present invention, the method further includes forming a blocking layer on the charge-trapping composite layer before forming the gate. The material of the blocking layer includes silicon oxide, silicon oxynitride and other dielectric material with high dielectric constant such as aluminum oxide and hafnium oxide.

According to the method of forming the non-volatile memory in a preferred embodiment of the present invention, the method of forming the tunnel layer includes forming a first oxide layer on the substrate. Thereafter, a tunnel nitride layer is formed on the first oxide layer. Next, a second oxide layer is formed on the tunnel nitride layer.

The present invention provides a non-volatile memory having a charge-trapping composite layer such that the charge-trapping composite layer includes at least two types of materials. Therefore, the non-volatile memory of the present invention has better programming and erasing performance and data retention ability compared with the conventional non-volatile memory having a charge-trapping layer made of only one material such as silicon nitride or silicon oxynitride. In addition, a high temperature processing operation is not required to form the silicon oxynitride layer or the silicon oxynitride region of the charge-trapping composite layer. Consequently, thermal budget of the manufacturing process can be lowered.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
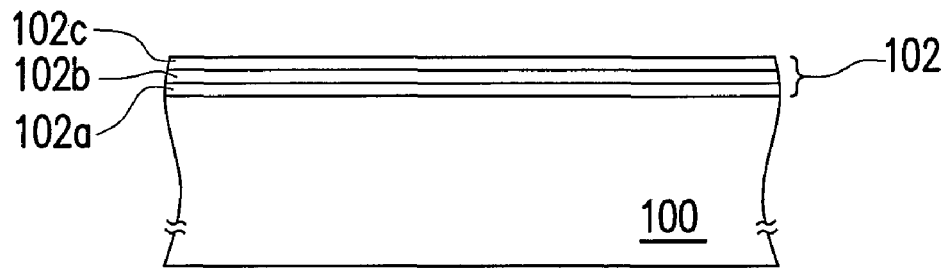
FIGS. 1A to 1C are schematic cross-sectional views showing a method of forming a non-volatile memory according a preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
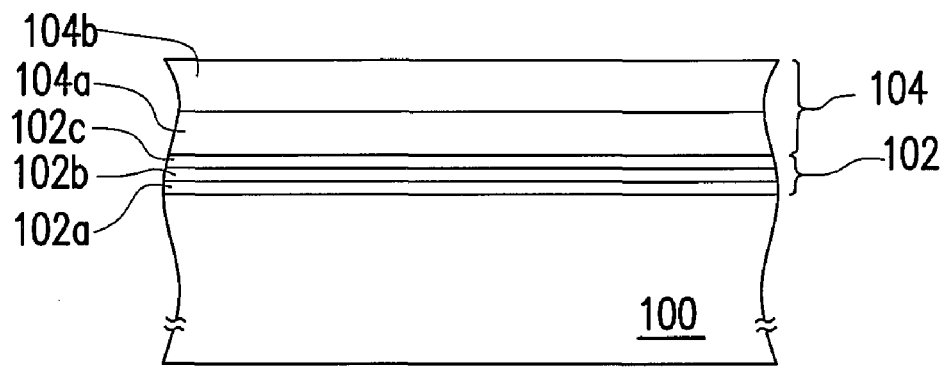
Figure 1C:
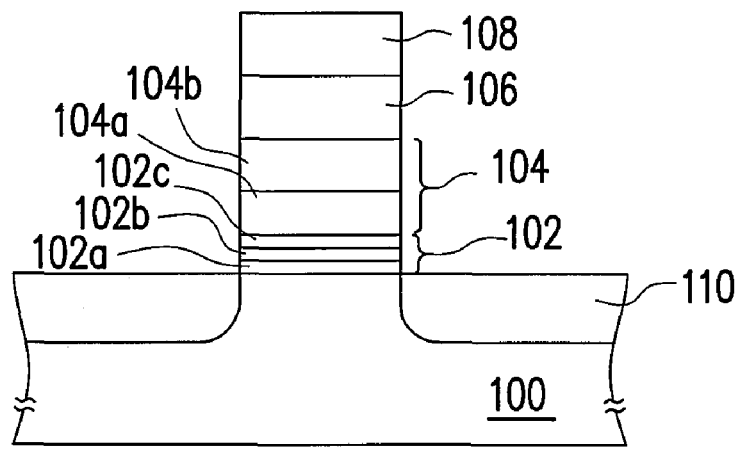

FIGS. 1A to 1C are schematic cross-sectional views showing a method of forming a non-volatile memory according a preferred embodiment of the present invention. First, as shown in FIG. 1A, a substrate 100 is provided. Thereafter, a tunnel layer 102 is formed on the substrate 100. The tunnel layer 120 can be a single layer structure of a dielectric layer. The material of the dielectric layer is silicon oxide or other high dielectric constant dielectric material. The method of forming the single structure dielectric layer includes performing a chemical vapor deposition process, a rapid thermal process or a plasma oxidation process. In the present embodiment, the tunnel layer 102, as shown in FIG. 1A, has a multi-layered structure. The method of forming the tunnel layer 102 includes forming a first oxide layer 102a on the substrate 100. Next, a tunnel nitride layer 102b is formed on the first oxide layer 102a. Finally, a second oxide layer 102c is formed on the tunnel nitride layer 102b. In other words, the tunnel layer 102 in the present embodiment is a stack that includes the first oxide layer 102a, the tunnel nitride layer 102b and the second oxide layer 102c. The method of forming the first oxide layer 102a includes performing a chemical vapor deposition process, atomic layer deposition process, a rapid thermal process or a plasma oxidation process. The method of forming the tunnel nitride layer 102b includes forming a dielectric layer, such as a silicon oxide layer or a silicon oxynitride layer, on the first oxide layer 102a. Thereafter, a nitridation process is performed to transform the dielectric layer into the tunnel nitride layer 102b. In an embodiment, the method of forming the tunnel nitride layer 102b also includes performing a chemical vapor deposition process or an atomic layer deposition process so as to form the tunnel nitride layer 102b on the first oxide layer 102a. The method of forming the second oxide layer 102c includes forming a dielectric layer, such as a nitride layer or a silicon oxynitride layer, on the tunnel nitride layer 102b. Thereafter, an oxidation process is performed to transform the dielectric layer into the second oxide layer 102c. In another embodiment, the method of forming the second oxide layer 102c also includes performing a chemical vapor deposition process or an atomic layer deposition process so as to form the second oxide layer 102c on the tunnel nitride layer 102b.

Next, as shown in FIG. 1B, a charge-trapping composite layer 104 is formed on the tunnel layer 102. It should be noted that the charge-trapping composite layer 104 is a multiple material composite layer made of at least two different types of materials. In the present embodiment, the charge-trapping composite layer 104 is a stack that includes a silicon nitride layer 104a and a silicon oxynitride layer 104b. Furthermore, the silicon oxynitride layer 104b is located on the silicon nitride layer 104a. However, the structure of the charge-trapping composite layer 104 of the present invention is not limited to the one as described in the above. In another embodiment, the charge-trapping composite layer 104 can also have a structure that includes a stack with a silicon nitride layer on a silicon oxynitride layer. The method of forming the silicon nitride layer 104a in the present embodiment includes performing a chemical vapor deposition process, an atomic layer deposition process or a plasma enhanced chemical vapor deposition process, and the method of forming the silicon oxynitride layer 104b includes performing a chemical vapor deposition process or a plasma enhanced chemical vapor deposition process. Furthermore, the thickness of the silicon oxynitride layer 104b is about 20% to 80% of the thickness of the charge-trapping composite layer 104, and the concentration of oxygen atoms in the silicon oxynitride layer 104b of the charge-trapping composite layer 104 is up to 15%.

Next, as shown in FIG. 1C, a blocking layer 106 and a gate 108 are formed on the charge-trapping composite layer 104. Thereafter, the gate 108, the blocking layer 106, the charge-trapping composite layer 104 and the tunnel layer 102 are defined and patterned. After the patterning process, a source/drain 110 is formed in the exposed substrate 100 on both sides of the tunnel layer 102 to complete the process of manufacturing the non-volatile memory. In the present embodiment, the material of the blocking layer 106 includes silicon oxide, silicon oxynitride or other dielectric material having a high dielectric constant, and the gate 108 is a stack with a metal layer or metal silicide layer on a polysilicon layer, for example. The foregoing metal and metal silicide include tungsten and tungsten silicide respectively.

Referring to FIG. 1C again, the present invention also provides a non-volatile memory structure. A tunnel layer 102, a charge-trapping composite layer 104, a blocking layer 106 and a gate 108 are sequentially stacked on a substrate 100. In the present embodiment, the charge-trapping composite layer 104 is a stack with a silicon oxynitride layer 104b on a silicon nitride layer 104a. However, the charge-trapping composite layer in the present invention is not limited to the foregoing structure. In another embodiment of the present invention, the charge-trapping composite layer is a stack with a silicon nitride layer on a silicon oxynitride layer.

In the present embodiment, the thickness of the silicon oxynitride layer 104b is about 20%~80% the thickness of the charge-trapping composite layer 104. In addition, the concentration of oxygen atoms in the silicon oxynitride layer of the charge-trapping composite layer 104 is up to 15%. Furthermore, the tunnel layer 102 includes a first oxide layer 102a located on the substrate 100, a tunnel nitride layer 102b located on the first oxide layer 102a and a second oxide layer 102c located on the tunnel nitride layer 102b. The non-volatile memory of the present invention also includes a source/drain 110 located in the substrate 100 on both sides of the tunnel layer 102. In one embodiment, the thickness of the first oxide layer 102a is up to about 2 nm. In another embodiment, the thickness of the first oxide layer 102a can be, for example, about 0.5~2 nm. Furthermore, in the other embodiment, the thickness of the first oxide layer 102a can be up to about 1.5 nm. Also, in one embodiment, the thickness of the tunnel nitride layer 102b can be up to about 2 nm. In the other embodiment, the thickness of the tunnel nitride layer 102b is about 1~2 nm. Moreover, in one embodiment, the thickness of the second oxide layer 102c is up to about 2 nm. In the other embodiment, the thickness of the second oxide layer 102c is about 1.5~2 nm.

In the present embodiment, the charge-trapping composite layer 104 is a stack with the silicon oxynitride layer 104b on the silicon nitride layer 104a. However, the charge-trapping composite layer 104 in the present invention is not limited to this structure.

Figure 2A:
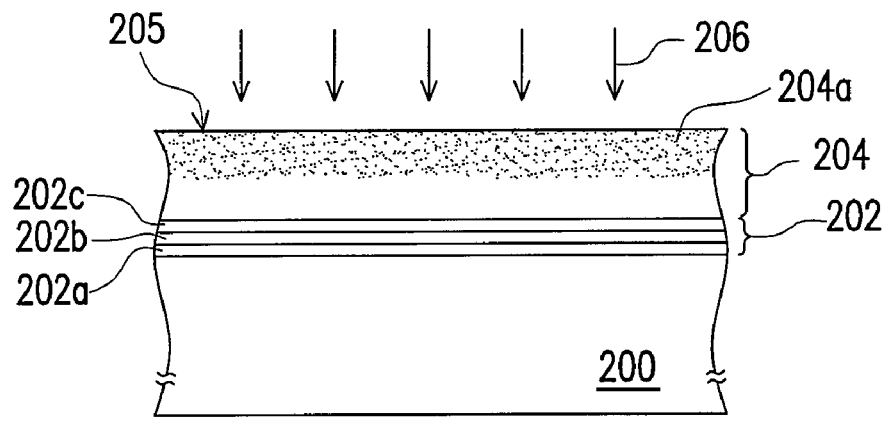
FIGS. 2A to 2C are schematic cross-sectional views showing a method of forming a non-volatile memory according another preferred embodiment of the present invention.
Figure 2B:
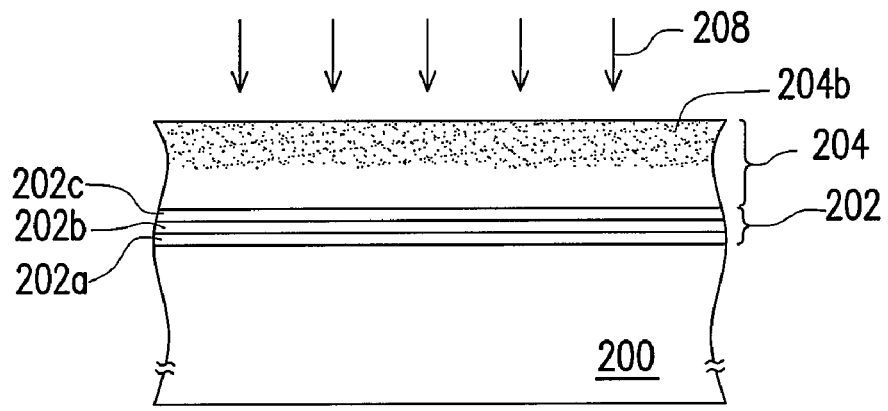
Figure 2C:
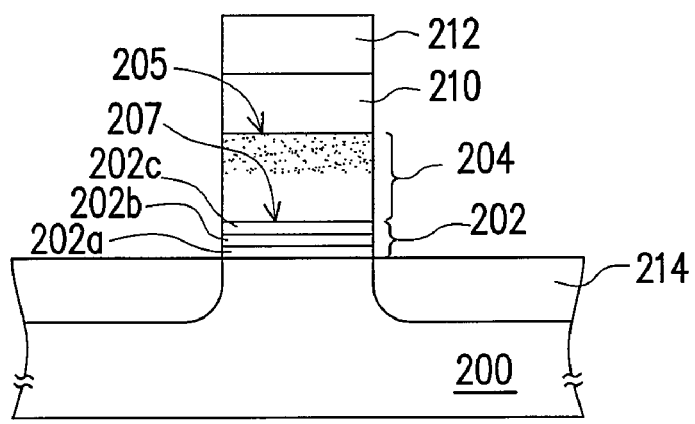

FIGS. 2A to 2C are schematic cross-sectional views showing a method of forming a non-volatile memory according to another preferred embodiment of the present invention. In the present embodiment, as shown in FIG. 2A, a charge-trapping composite layer 204 is formed on a substrate 202 having a tunnel layer 202 thereon. Since the structure and the method of forming the tunnel layer 202 is identical to the structure and method of forming the tunnel layer 102 in the previous embodiment, a detailed description is omitted. The charge-trapping composite layer 204 is made of at least two different types of materials. The method of forming the charge-trapping composite layer 204 includes forming a silicon nitride layer 204 on the tunnel layer 202. Thereafter, an oxidation process 206 is performed to form a silicon oxynitride region 204a in the silicon nitride layer 204. The silicon oxynitride region 204a is formed close to a top surface 205 of the silicon nitride layer 204.

Next, as shown in FIG. 2B, a nitridation process 208 is performed so as to transform the silicon oxynitride region 204a into a nitrogen-rich silicon oxynitride region 204b. The nitridation process 208 includes a plasma nitridation process and a thermal nitridation process. After the nitridation process 208, the concentration of oxygen atoms in silicon oxynitride region of the charge-trapping composite layer 204 is up to 15%. Furthermore, the thickness of the nitrogen-rich silicon oxynitride region 204b is about 20%~80% of the thickness of the charge-trapping composite layer 204. Moreover, the thickness in the charge-trapping composite layer 204 containing only the silicon nitride material is not less than 4 nanometers and the thickness of the nitrogen-rich silicon oxynitride region 204b is no larger than 4 nanometer.

Next, as shown in FIG. 2C, a blocking layer 210 and a gate 212 is formed on the charge-trapping composite layer 204. Thereafter, the gate 212, the blocking layer 210, the charge-trapping composite layer 204 and the tunnel layer 202 are defined and patterned. After the patterning process, a source/drain 214 is formed in the exposed substrate 200 on both sides of the tunnel layer 202 so as to complete the manufacturing of the non-volatile memory. In the present embodiment, the material of the blocking layer 210 includes silicon oxide, silicon oxynitride or other dielectric material having a high dielectric constant, and the gate 212 is a stack with a metal layer or a metal silicide layer on a polysilicon layer, for example. The foregoing metal and metal silicide include tungsten and tungsten silicide respectively.

Next, referring also to FIG. 2C, the present invention also provides a non-volatile memory structure. A tunnel layer 202, a charge-trapping composite layer 204, a blocking layer 210 and a gate 212 are sequentially stacked on a substrate 200. The charge-trapping composite layer 204 is made of at least two types of materials, for example, including a silicon oxynitride material and a silicon nitride material. The composition of the silicon oxynitride gradually decreases from a top surface 205 of the charge-trapping composite layer 204 to a bottom surface 207 of the charge-trapping composite layer 204. In addition, the concentration of the oxygen atoms in the silicon oxynitride material of the charge-trapping composite layer 204 is up to 15%. The silicon oxynitride material is distributed close to a top surface of the charge-trapping composite layer 204 and forms a silicon oxynitride region 204a (as shown in FIG. 2A) or a nitrogen-rich silicon oxynitride region 204b.

In addition, the tunnel layer 202 includes a first oxide layer 202a located on the substrate 200, a tunnel nitride layer 202b located on the first oxide layer 202a and a second oxide layer 202c located on the tunnel nitride layer 202b. The non-volatile memory of the present invention further includes a source/drain 214 located in the substrate 200 on both sides of the tunnel layer 202. In one embodiment, the thickness of the first oxide layer 202a is up to about 2 nm. In another embodiment, the thickness of the first oxide layer 202a can be, for example, about 0.5~2 nm. Furthermore, in the other embodiment, the thickness of the first oxide layer 202a can be up to about 1.5 nm. Also, in one embodiment, the thickness of the tunnel nitride layer 202b can be up to about 2 nm. In the other embodiment, the thickness of the tunnel nitride layer 202b is about 1~2 nm. Moreover, in one embodiment, the thickness of the second oxide layer 202c is up to about 2 nm. In the other embodiment, the thickness of the second oxide layer 202c is about 1.5~2 nm.

Figure 3:
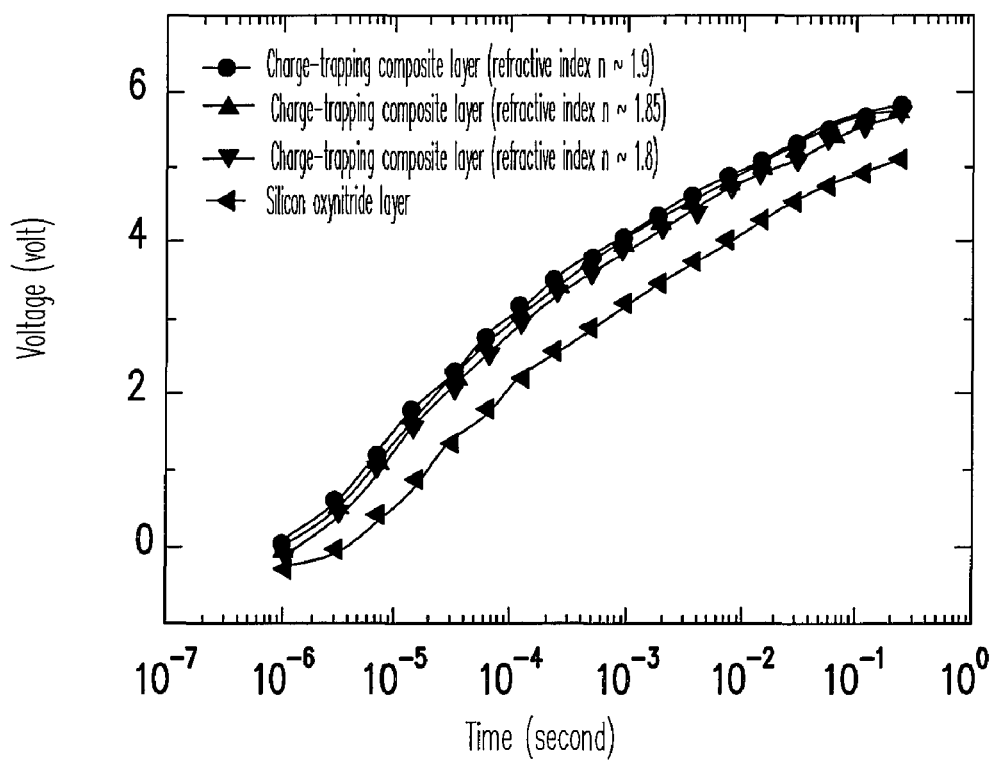
FIG. 3 is a graph with curves showing the relationships of programming voltage versus time of the non-volatile memory according to the present invention.
Figure 4:
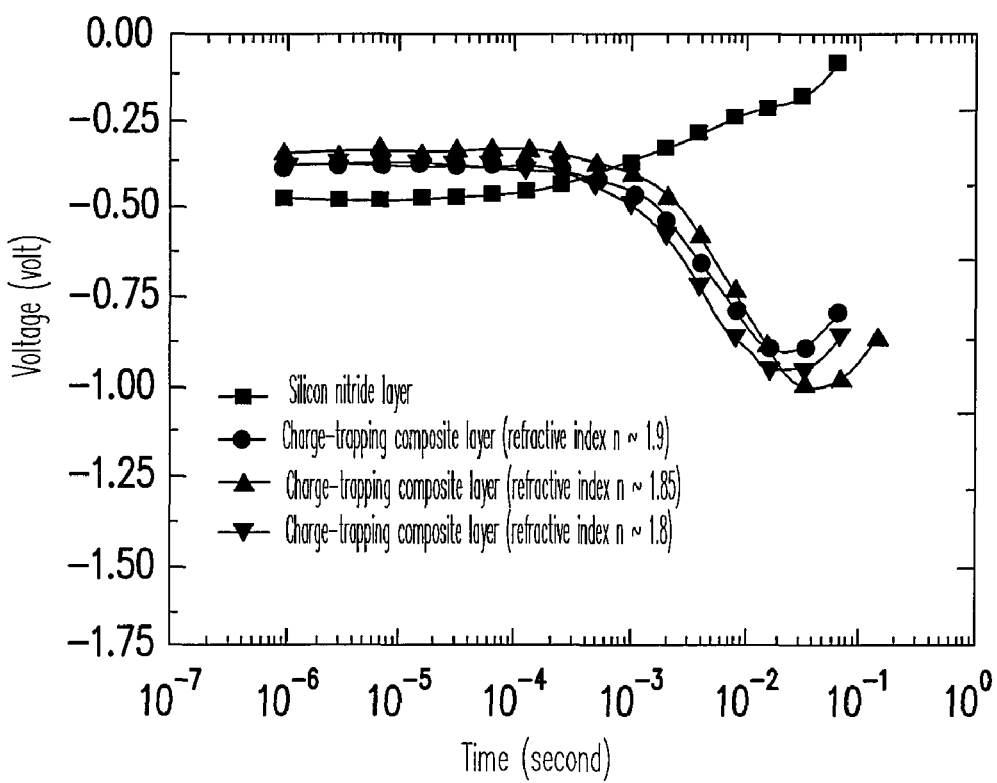
FIG. 4 is a graph with curves showing the relationships of erasing voltage versus time of the non-volatile memory according to the present invention.
Figure 5:
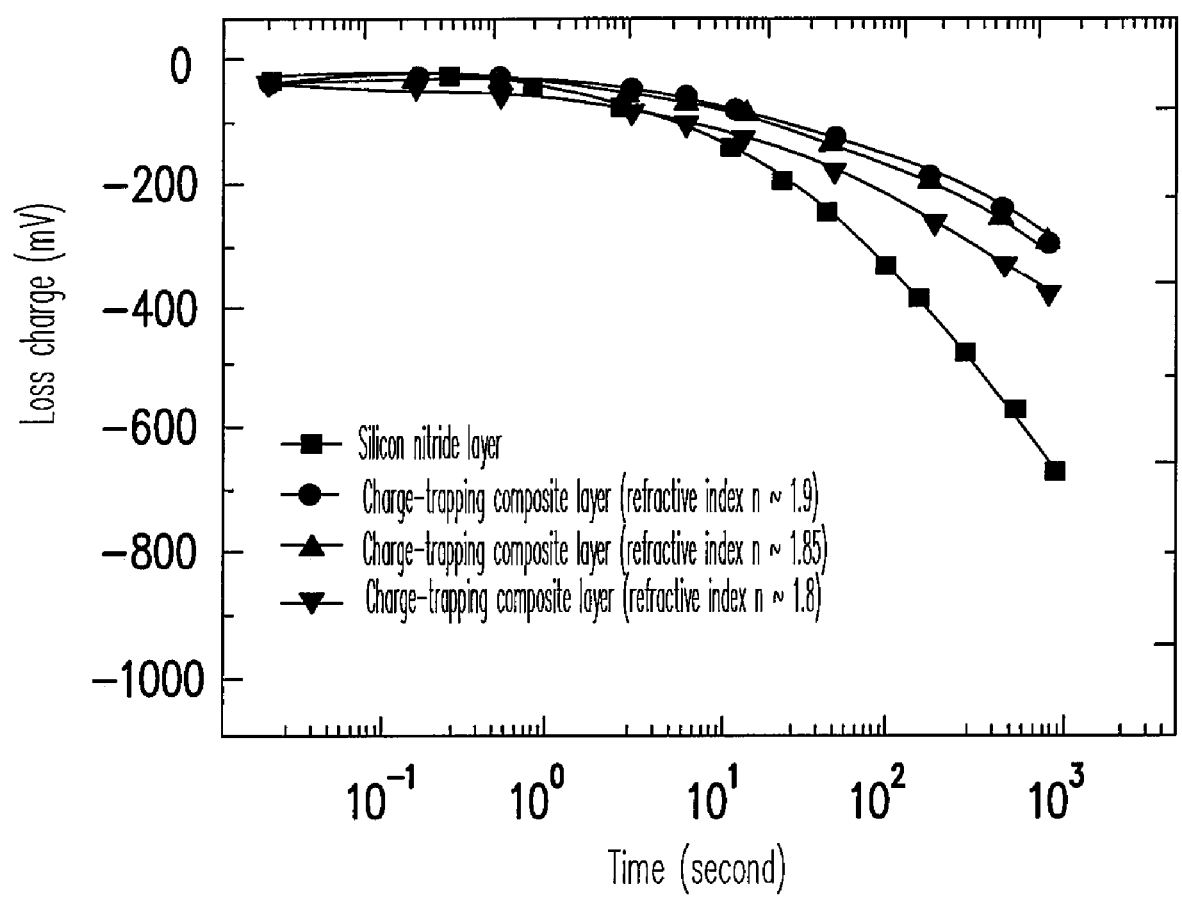
FIG. 5 is a graph with curves showing the relationships of data retention ability versus time of the non-volatile memory according to the present invention.

FIG. 3 is a graph with curves showing the relationships of programming voltage versus time of the non-volatile memory according to the present invention. FIG. 4 is a graph with curves showing the relationships of erasing voltage versus time of the non-volatile memory according to the present invention. FIG. 5 is a graph with curves showing the relationships of data retention ability versus time of the non-volatile memory according to the present invention. As shown in FIG. 3, the non-volatile memory having the charge-trapping composite layer of the present invention has better programming performance compared with a non-volatile memory having a charge-trapping layer made of silicon oxynitride. Moreover, when the composition of the nitrogen atoms in the silicon oxynitride layer or the silicon oxynitride region of the charge-trapping composite layer is increased, that is, the refractive index of the silicon oxynitride layer or the silicon oxynitride region is increased, the programming performance of the non-volatile memory having a charge-trapping composite layer of the present invention remains stable. As shown in FIGS. 4 and 5, the non-volatile memory having a charge-trapping composite layer of the present invention has better erasing ability and data retention ability compared with a non-volatile memory having a charge-trapping layer made of only silicon nitride.

In summary, the present invention provides a non-volatile memory having a charge-trapping composite layer and the charge-trapping composite layer is made of at least two types of materials. Therefore, the non-volatile memory of the present invention has better programming and erasing performance and data retention ability compared with the conventional non-volatile memory having a charge-trapping layer made of only one material such as silicon nitride or silicon oxynitride. In addition, a high temperature process is not required to form the silicon oxynitride layer or the silicon oxynitride region of the charge-trapping composite layer. Consequently, thermal budget of the manufacturing process can be lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a non-volatile memory on a substrate, comprising:

forming a tunnel layer on the substrate;

forming a charge-trapping composite layer on the tunnel layer comprising:

forming a silicon nitride layer on the tunnel layer; and forming a silicon oxynitride layer on the silicon nitride layer, wherein a concentration of oxygen atoms in the silicon oxynitride layer of the charge-trapping composite layer is up to 15%;

forming a gate over the charge-trapping composite layer; and patterning the gate, the charge-trapping composite layer and the tunnel layer, and forming a source/drain in the substrate on both sides of the patterned tunnel layer.

2. The method of forming the non-volatile memory according to claim 1, wherein the method of forming the silicon nitride layer comprises performing a chemical vapor deposition process.

3. The method of forming the non-volatile memory according to claim 1, wherein the method of forming the silicon nitride layer comprises performing a plasma enhanced chemical vapor deposition.

4. The method of forming the non-volatile memory according to claim 1, wherein the method of forming the silicon nitride layer comprises performing an atomic layer deposition process.

5. The method of forming the non-volatile memory according to claim 1, wherein the method of forming the silicon oxynitride layer comprises performing a chemical vapor deposition process.

6. The method of forming the non-volatile memory according to claim 1, wherein the method of forming the silicon oxynitride layer comprises performing a plasma enhanced chemical vapor deposition.

7. The method of forming the non-volatile memory according to claim 1, wherein a thickness of the silicon oxynitride layer is about 20%~80% thickness of the charge-trapping composite layer.

8. The method of forming the non-volatile memory according to claim 1, wherein the method of forming the charge-trapping composite layer comprises:

forming a silicon nitride material layer on the tunnel layer; and performing an oxidation process on a top portion of the silicon nitride material layer so as to form the silicon oxynitride layer, wherein the silicon oxynitride layer is close to a top surface of the silicon nitride material layer.

9. The method of forming the non-volatile memory according to claim 8, wherein the method further comprises performing a nitridation process to transform the silicon oxynitride layer into a nitrogen-rich silicon oxynitride region after performing the oxidation process.

10. The method of forming the non-volatile memory according to claim 9, wherein the nitridation process comprises a plasma nitridation process and a thermal nitridation process.

11. The method of forming the non-volatile memory according to claim 8, wherein the concentration of oxygen atoms in the silicon oxynitride layer of the charge-trapping composite layer is up to 15% after performing the nitridation process.

12. The method of forming the non-volatile memory according to claim 8, wherein a thickness of the silicon oxynitride layer is about 20%~80% thickness of the charge-trapping composite layer.

13. The method of forming the non-volatile memory according to claim 1, wherein the method further comprises forming a blocking layer on the charge-trapping composite layer before forming the gate.

14. The method of forming the non-volatile memory according to claim 13, wherein a material of the blocking layer comprises silicon oxide or silicon oxynitride.

15. The method of forming the non-volatile memory according to claim 13, wherein a material of the blocking layer comprises a dielectric material having a high dielectric constant including aluminum oxide or hafnium oxide.

16. The method of forming the non-volatile memory according to claim 1, wherein the method of forming the tunnel layer comprises:

forming a first oxide layer on the substrate;

forming a tunnel nitride layer on the first oxide layer; and forming a second oxide layer on the tunnel nitride layer.

17. The method of forming the non-volatile memory according to claim 16, wherein the thickness of the first oxide layer is up to about 2 nm.

18. The method of forming the non-volatile memory according to claim 16, wherein the thickness of the first oxide layer is about 0.5~2 nm.

19. The method of forming the non-volatile memory according to claim 16, wherein the thickness of the first oxide layer can be up to about 1.5 nm.

20. The method of forming the non-volatile memory according to claim 16, wherein the thickness of the tunnel nitride layer can be up to about 2 nm.

21. The method of forming the non-volatile memory according to claim 16, wherein the thickness of the tunnel nitride layer is about 1~2 nm.

22. The method of forming the non-volatile memory according to claim 16, wherein the thickness of the second oxide layer is up to about 2 nm.

23. The method of forming the non-volatile memory according to claim 16, wherein the thickness of the second oxide layer is about 1.5~2 nm.

\* \* \* \* \*